United States Patent
Hasnain

(10) Patent No.: US 8,350,485 B2
(45) Date of Patent: *Jan. 8, 2013

(54) MODULAR LED LIGHT BULB

(75) Inventor: Ghulam Hasnain, Palo Alto, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/073,726

(22) Filed: Mar. 28, 2011

(65) Prior Publication Data

US 2011/0169407 A1   Jul. 14, 2011

Related U.S. Application Data

(63) Continuation of application No. 12/467,191, filed on May 15, 2009, now Pat. No. 7,956,546.

(51) Int. Cl.
*H05B 39/06* (2006.01)
*H05B 1/02* (2006.01)

(52) U.S. Cl. .................. 315/200 R; 315/209 SC

(58) Field of Classification Search .......... 315/291, 315/307, 312, 200 R, 185 R, 209 SC; 362/800
See application file for complete search history.

(56) References Cited

U.S. PATENT DOCUMENTS

| | | | | |
|---|---|---|---|---|
| 6,596,977 B2 * | 7/2003 | Muthu et al. | | 250/205 |
| 7,215,086 B2 * | 5/2007 | Maxik | | 315/247 |
| 7,458,934 B2 * | 12/2008 | Roberts et al. | | 600/249 |
| 7,479,662 B2 * | 1/2009 | Soules et al. | | 257/98 |
| 7,482,567 B2 * | 1/2009 | Hoelen et al. | | 250/205 |
| 7,524,097 B2 * | 4/2009 | Turnbull et al. | | 362/545 |
| 7,641,364 B2 * | 1/2010 | Abbondanzio et al. | | 362/295 |
| 7,661,852 B2 * | 2/2010 | Yu | | 362/362 |
| 7,815,338 B2 | 10/2010 | Siemiet et al. | | |
| 7,926,975 B2 | 4/2011 | Siemiet et al. | | |
| 7,938,562 B2 | 5/2011 | Ivey et al. | | |
| 7,946,729 B2 | 5/2011 | Ivey et al. | | |
| 7,956,546 B2 * | 6/2011 | Hasnain | | 315/200 R |
| 2004/0222516 A1 * | 11/2004 | Lin et al. | | 257/712 |
| 2006/0097245 A1 * | 5/2006 | Aanegola et al. | | 257/26 |
| 2006/0098440 A1 * | 5/2006 | Allen | | 362/294 |
| 2007/0109782 A1 * | 5/2007 | Wolf et al. | | 362/253 |
| 2007/0267976 A1 * | 11/2007 | Bohler et al. | | 315/112 |
| 2008/0122364 A1 * | 5/2008 | McClellan | | 315/51 |
| 2008/0157698 A1 * | 7/2008 | Tan et al. | | 315/294 |

* cited by examiner

*Primary Examiner* — Minh D A
(74) *Attorney, Agent, or Firm* — Calvin B. Ward

(57) ABSTRACT

An LED-based lighting device and method for making the same are disclosed. The lighting device includes an LED light source mounted on a heat sink, a power adaptor, and a controller. The power adaptor is configured to be interchangeable with a conventional incandescent bulb power adapter. The controller provides an average current to the LED light source when power is coupled to the device via the power adaptor. The average current causes the LED light source to generate light of a predetermined standard intensity that is substantially independent of variations in the LED light source from device to device. In one aspect of the invention, the LED light source includes a plurality of LEDs connected in series, the LEDs are bonded to the heat sink and connected to one another in series by wire bonds and to conducting traces on the heat sink.

18 Claims, 6 Drawing Sheets

MODULAR LED LIGHT BULB

CROSS REFERENCE TO RELATED APPLICATIONS

This is a continuation of application Ser. No. 12/467,191 filed on May 15, 2009, and issued as U.S. Pat. No. 7,956,546.

BACKGROUND OF THE INVENTION

Light emitting diodes (LEDs) are attractive candidates for replacing conventional light sources such as incandescent lamps and fluorescent light sources. The LEDs have higher light conversion efficiencies than incandescent lamps and longer lifetimes than both types of conventional light sources. Furthermore, the conversion efficiencies of LEDs continue to improve.

An LED produces light in a relatively narrow spectral band. Hence, to produce a light source having an arbitrary color, a compound light source having multiple LEDs is typically utilized or part of the light from a single LED must be converted to light of a second wavelength, which is mixed with the light from the original LED. For example, an LED-based white light source that provides an emission that is perceived as white by a human observer can be constructed by combining light from arrays of red, blue, and green emitting LEDs that are generating the correct intensity of light at each color. Alternatively, part of the light from a blue LED can be used to excite a yellow phosphor to produce a light source that is perceived to be white.

The LEDs are typically packaged in packages that have one or more dies mounted on some form of substrate that includes power terminals for powering the dies and a heat transfer surface for removing heat from the dies. The package may also include a phosphor layer in the case of a white LED or a controller for setting the relative intensities of the colored LEDs in the case of a red, blue, and green light source that is designed to emit light over a selectable gamut of colors. The packaged LEDs are then incorporated into a final light bulb assembly or other form of luminaire that is configured to match a power source. For example, in the case of a luminaire that is to replace a conventional incandescent light source, the luminaire could include a conventional bayonet or threaded light connector that matches the conventional light sockets used by a corresponding incandescent light.

Unfortunately, the performance of an LED depends critically on the manner in which the LED is packaged. The light conversion efficiency of the LED, as well as any phosphor coating, depends on the temperature at which the LED operates and how the LED is driven. In addition, there is considerable variability from LED to LED, particularly in the case of phosphor converted LEDs, since both the variability of the LED chip and the phosphor coating can introduce variability into the performance of the final packaged LED. While the manufacturer of the packaged LEDs can "bin" the final packaged LEDs to provide products having more uniformity, the cost of such binning is significant.

Furthermore, the temperature at which the LED operates is determined by the heat sink and heat dissipating surfaces in the final luminaire. Different packaged LEDs that have the same light output at one temperature and drive current can have substantially different light output at another temperature. Hence, until the packages are assembled in the final luminaire, the extent of any such variability cannot be fully determined.

This places the burden on the luminaire manufacturer who must have the facilities needed to test the packaged LEDs in that manufacturer's luminaire, since a standardized part is not available that provides a light source with a standardized output in terms of intensity when connected to a standard AC electrical outlet. Hence, the manufacturer of the luminaire must install and maintain calibration equipment on the manufacturer's production line as well as setting the power levels for the LEDs for each light source produced so that the resulting luminaires are uniform in light output. This increases the capital investment needed to establish the production line.

Finally, even in the case of "white" LEDs, there are different color temperatures varying from "cool white" to "warm white". Different phosphor coatings are used to create each of the color variations in phosphor-converted sources. These phosphors are normally integrated in the LED package, and hence, changing the phosphor to achieve a different color temperature requires that the LED be replaced as well. Accordingly, a luminaire manufacturer must stock different LED/phosphor sources. Similarly, the end user must change the entire luminaire to achieve a new color temperature with phosphor converted light sources. Similarly, if the LED fails, both the LED and the associated phosphor must be replaced.

SUMMARY OF THE INVENTION

The present invention includes an LED-based lighting device and method for making the same. The lighting device includes an LED light source mounted on a heat sink and a power adapter. The power adapter is configured to be interchangeable with conventional incandescent or fluorescent bulb power adapters. In one aspect of the invention, a controller provides an average current to the LED light source when power is coupled to the device via the power adapter. The average current causes the LED light source to generate light of a predetermined standard intensity of light that is substantially independent of variations in the LED light source from device to device. In one aspect of the invention, the LED light source includes a plurality of LEDs connected in series, the LEDs are bonded to the heat sink and connected to one another in series by wire bonds and to conducting traces on the heat sink.

In another aspect of the invention, the light device includes interchangeable globes that include a phosphor layer that converts part of the light from the spectrum generated by the LED light source to another spectrum. By changing the globes, the output spectrum of the lighting device can be altered without changing the light source. In addition, the globes can be recycled if the LED light source requires replacement.

In another aspect of the invention, the device includes a first half-wave rectifier that converts an AC voltage coupled to the power adapter to a first half-wave rectified power source having a duty cycle that provides the predetermined light intensity when the first half-wave rectified power source is used to power the light source. The first half-wave rectifier can include a silicon-controlled rectifier having a control signal chosen to provide the predetermined light intensity. The control signal has a value that depends on a measured value of the light from the LED light source when the light source is operated on the heat sink. In another aspect of the invention, the LED light source includes first and second LEDs, the first LED being powered by the first half-wave rectifier and the second LED being powered by a second half-wave rectifier that has an output that is 180 degrees out of phase with the first half-wave rectified power source.

In another aspect of the invention, the heat sink is adapted for receiving a light-diffusing element that diffuses and redirects light from the light source. The device can also include a photodetector that measures an intensity of light in the diffusing element, the controller utilizing the measured light intensity to maintain the predetermined standard intensity.

DETAILED DESCRIPTION OF THE PREFERRED EMBODIMENTS OF THE INVENTION

Figure 1:
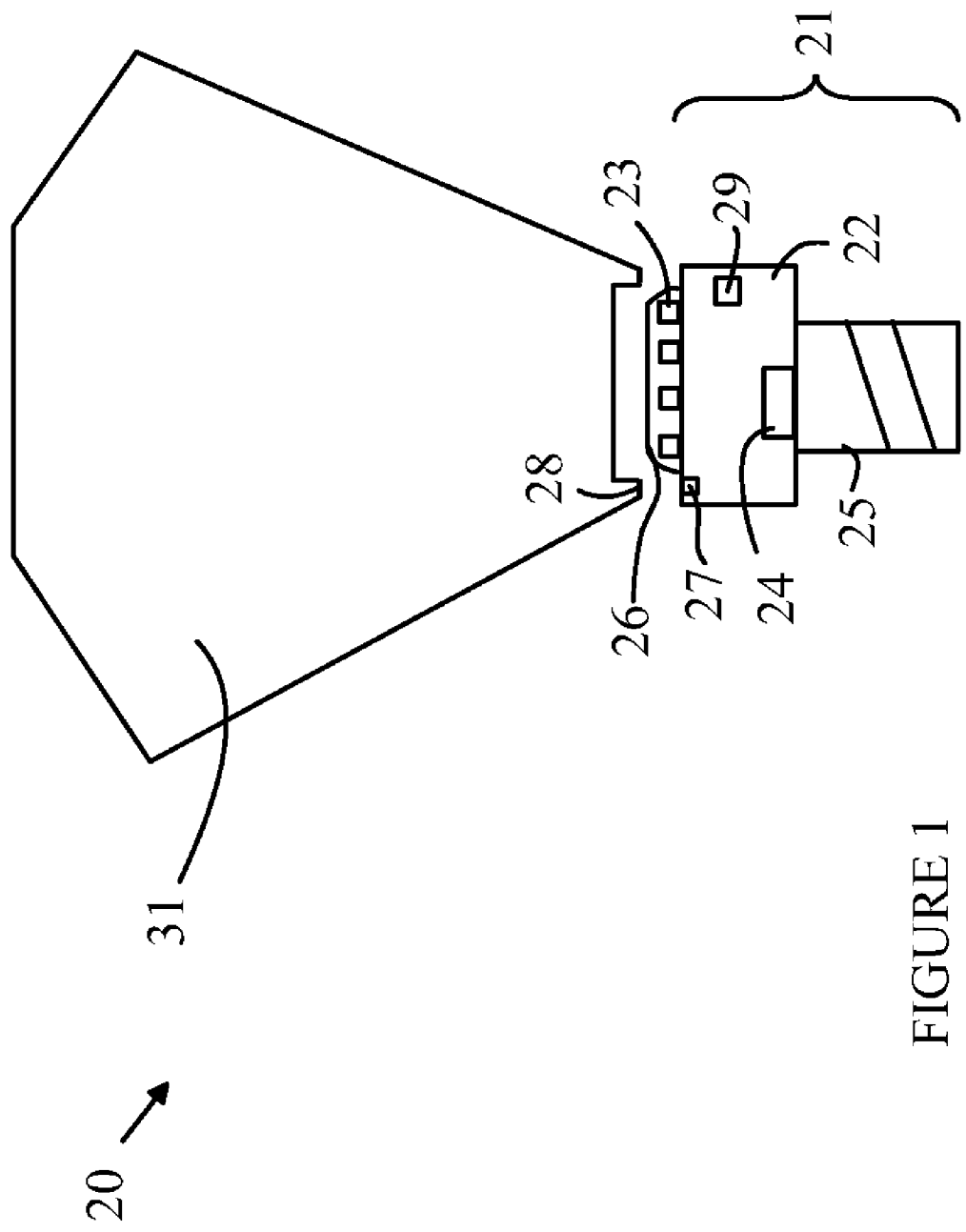
FIG. 1 is a cross-sectional view of a light base unit according to the present invention that can be connected to any of a number of light diffusers.

The manner in which the present invention provides its advantages can be more easily understood with reference to FIG. 1 which is a cross-sectional view of lighting device 20 with a light base unit 21 according to the present invention that can be connected to any of a number of light diffusers 31. Base unit 21 includes a heat sink 22 on which a plurality of LEDs 23 are mounted. The number of LEDs depends on the particular application and power rating of the base unit. A controller 24 powers the LEDs. To simplify the drawings, the connections between controller 24 and the LEDs have been omitted from the drawing. A standard connector 25 such as a screw-in bulb connector is used to connect base unit 21 to a conventional light socket. Non-screw-in connectors such as "bayonet" connectors can also be utilized.

As noted above, the LEDs can vary in their light output due to variations in the manufacturing process utilized to fabricate the LEDs. In addition, in some applications, the LEDs are covered by a phosphor layer 26 that converts some or all of the light from the LEDs to light having a different spectrum. For example, in the case of white LEDs, a yellow phosphor is often utilized. The conversion efficiency of the phosphors utilized for this purpose often depends on the temperature of the phosphor layer, and hence, the light output cannot be predicted until the LEDs and phosphor layer are coupled to heat sink 22.

In one aspect of the invention, the light generated by base unit 21 is adjusted after the LEDs have been mounted on heat sink 22 and covered with any phosphor layer. The power supplied by controller 24 to the LEDs is adjusted until the light output is within a predetermined specified range. Information specifying the average current to the LEDs that provides the desired light output is then stored in controller 24 and utilized by controller 24 to set the average current used to power the LEDs. In this manner, each base unit is adjusted to provide the same light output, and hence, the manufacturer of a luminaire that utilizes base unit 21 is ensured of a reproducible product. The average current through the LEDs can be controlled by utilizing a constant current source that outputs the maximum current that is to be applied to the LEDs. The output of this current source is then switched on and off with a duty cycle that provides the desired average current. Alternatively, a DC signal can be applied to the LEDs in which the current or voltage is adjusted to provide the desired average current level.

The LEDs can be powered either by an oscillating voltage source or a DC source. The human eye measures only the average light output over short periods of time, and hence, does not perceive the oscillating light output as flickering if the frequency of oscillation is above a minimum frequency which is of the order of 30 cycles per second. Accordingly, the average current can be controlled by varying the portion of the oscillating waveform over which the LED is biased to generate light. The fraction of the voltage cycle over which light is generated is referred to as the "duty factor". By varying the duty cycle, the average intensity can be controlled while leaving the peak drive voltage fixed. Alternatively, a variable current source could be utilized in which the drive voltage is altered to provide the desired average current.

Data needed by the controller to store the desired average current to the LEDs can be input to the controller either through the power connection provided by connector 25 or by a separate connector that is accessed during the testing and calibration of base unit 21. Signaling on AC power lines is known to the art, and hence, will not be discussed in detail here. In another aspect of the invention, a photodetector 27 is included in base unit 21 and monitored by controller 24. An optically based signal can be directed at photodetector 27 to provide the needed signaling. It should be noted that this arrangement allows controller 24 to be signaled optically even after diffuser 31 has been attached to base unit 21.

In another aspect of the present invention, photodetector 27 can be monitored during operation after diffuser 31 has been attached to allow controller 24 to compensate for aging in the LEDs. The light output of the LEDs typically decreases over time, and hence, in the absence of some form of compensation scheme, the light output of lighting device 20 will dim. In principle, the light output of device 20 could be monitored and the average current to the LEDs could then be increased to compensate for the aging of the LEDs. By providing an optically transparent window 28 in diffuser 31 that is positioned opposite to photodetector 27, controller 24 can monitor the light level in diffuser 31 during operation of lighting device 20. The diffuser mixes the light from the various LEDs 23, and hence, the output of photodetector 27 is related to the total light output from base unit 21. It should be noted that the exact relationship between the output of photodetector 27 and the light being generated by lighting device 20 is difficult to determine due to variations in the geometry of the different diffusers and the efficiency of light coupling to photodetector 27, which varies from device to device. However, it should be noted that controller 24 has been programmed with an initial average current that ensures that the light output of base unit 21 is at the correct value. Hence, controller 24 only needs to memorize the output of photodetector 27 after diffuser 31 is attached and servo the average current to maintain this light output value. A predetermined optical signal can be directed to lighting device 20 after the device is assembled to cause controller 24 to store the target output value for photodetector 27.

In another aspect of the present invention, base unit 21 includes a temperature sensor 29 that monitors the temperature of heat sink 22. As noted above, the light output of the LEDs varies with temperature. The average current provided by controller 24 is determined at some predetermined temperature when the controller is initialized to provide a standardized light output. However, the operating temperature of base unit 21 could vary due to environmental conditions and/or the presence of diffuser 31. The variation in light output as a function of temperature can be measured for each base unit during calibration and a corresponding change in average current through the LEDs determined to compensate for changes in light output as a function of temperature. In embodiments in which photodetector 27 is included in base unit 21, photodetector 27 and the associated servo loop will provide the compensation in question provided the output of photodetector 27 is memorized at the predetermined temperature.

Figure 2:
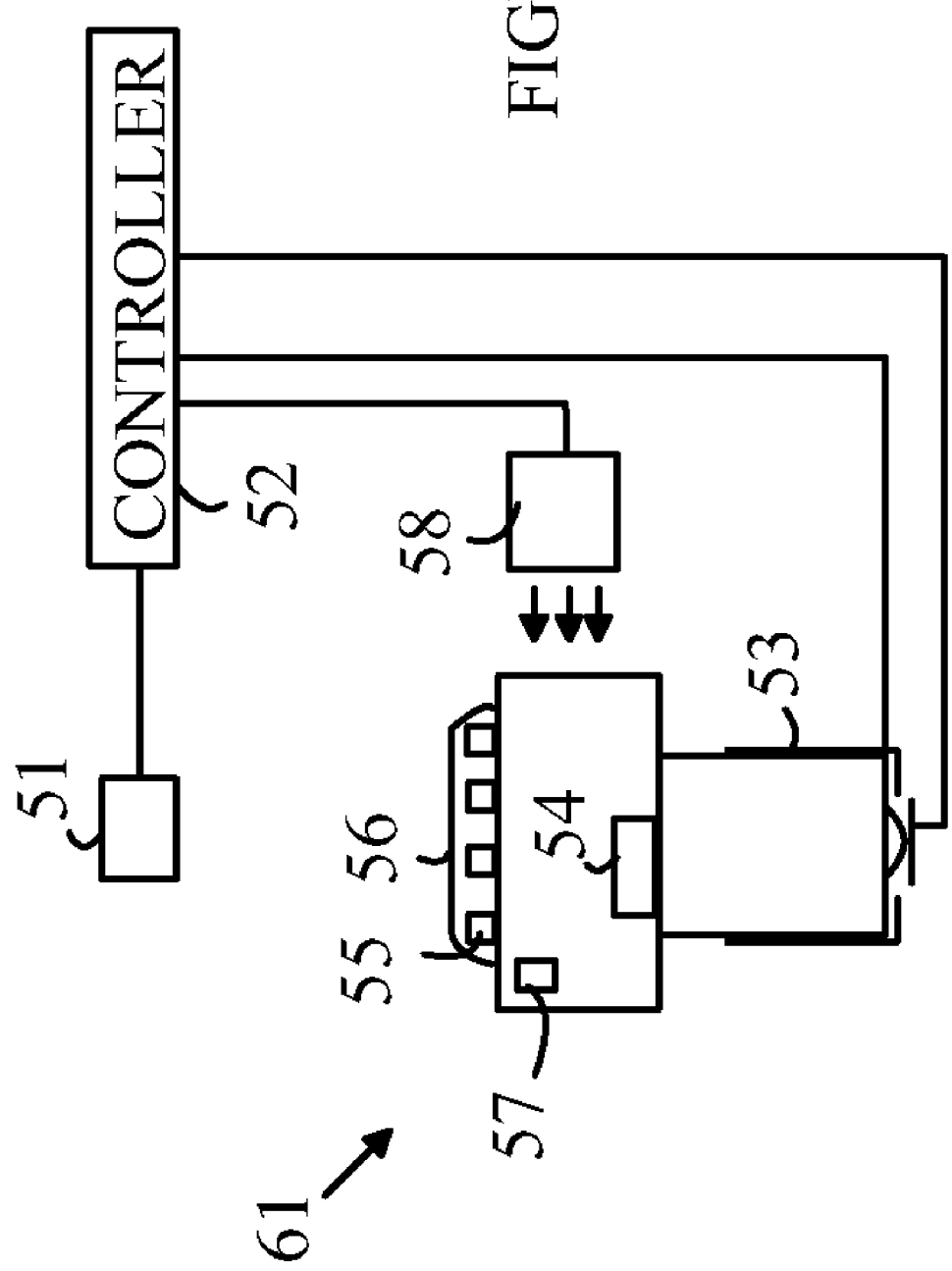
FIG. 2 illustrates an initialization setup that could be used at the factory to initialize base units that are to be connected to a conventional light socket.

Refer now to FIG. 2, which illustrates an initialization setup that could be used at the factory to initialize base units that are to be connected to a conventional light socket. As noted above, the present invention provides a standardized base unit that can be used with a variety of light diffusers to construct lighting devices that are a direct replacement for existing incandescent bulbs. The base units are set at the factory such that each base unit outputs a predetermined light intensity when plugged into the conventional light socket associated with the incandescent bulb that is being replaced. The initialization of the base unit is carried out after the LEDs shown at 55 have been bonded to the heat sink and any phosphor layers such as layer 56 have been deposited. Base unit 61 is plugged into a conventional light socket 53 and is powered from a controller 52 during the initialization process. In this embodiment, the base unit utilizes a non-threaded connector such as a bayonet connector. The light generated by base unit 61 is measured by a photodetector 51. Controller 52 controls the average current that is coupled to LEDs 55 during the initialization process. Controller 52 varies the average current until the light output from base unit 61 is within the desired range. This current value is then communicated to base unit controller 54, which stores the value for use in normal operation.

As noted above, in some embodiments of the present invention, base unit 61 includes a temperature sensor 57 that is used by base unit controller 54 to measure the temperature of the heat sink so that base unit controller 54 can compensate for temperature differences between the temperature at which the initialization current is determined and the actual operating temperature of base unit 61. In this phase of the initialization process, base unit 61 is heated by a radiant heater 58 that is under the control of controller 52. For each of a number of temperatures, the average current that provides the desired light output is also determined and stored in base unit controller 54. During the normal operation of base unit 61, the stored table of temperatures and corresponding average currents is interpolated to determine the correct average current to be applied to base unit 61.

Figure 3:
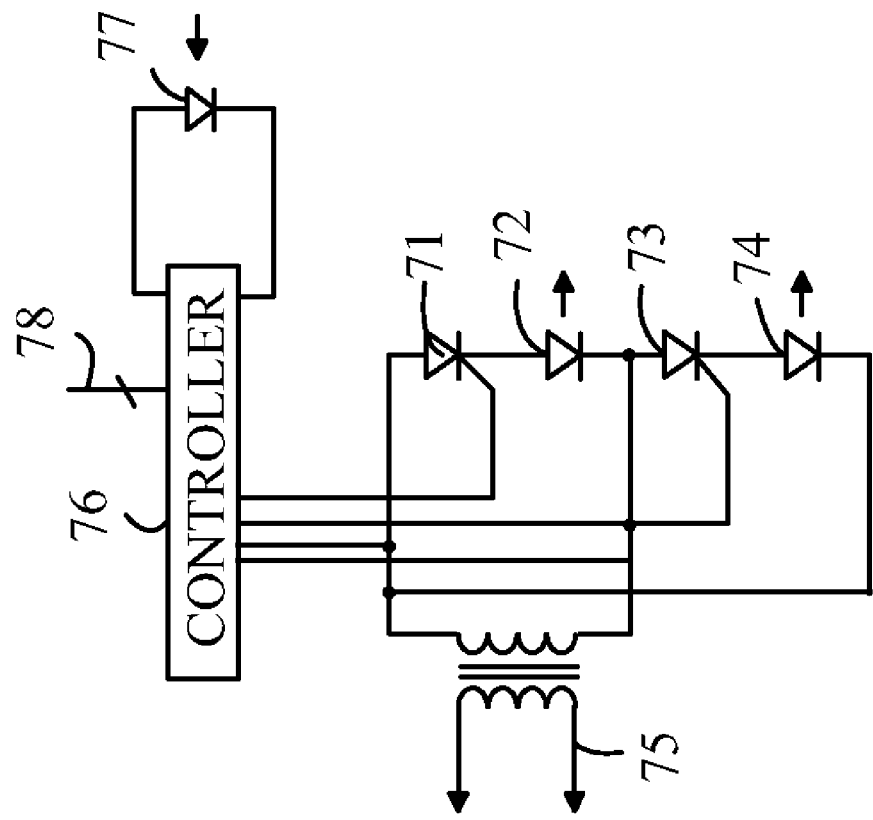
FIG. 3 illustrates one embodiment of a power circuit that can be utilized in a base unit according to the present invention.
Figure 3:
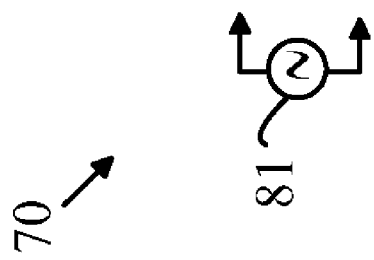

In many cases, the incandescent lights that are to be replaced by LED-based lighting devices are driven by AC power sources. In one aspect of the present invention, the base unit includes an AC to DC converter, and the DC voltage is used to power a circuit that controls the average current through the LEDs. Refer now to FIG. 3, which illustrates one embodiment of a power circuit that can be utilized in a base unit according to the present invention. Circuit 70 assumes that the base unit controller 76 communicates with the initialization setup discussed above by a light signal received by photodiode 77. As noted above, photodiode 77 can also be used for monitoring the light levels in a diffuser that is attached to the base unit.

Circuit 70 is powered from an AC source 81 when the base unit is inserted in a corresponding socket by a connector such as connector 25 discussed above. A transformer 75 that can be built into connector 25 can be utilized to reduce the source voltage to a value that is determined by the maximum voltage that can be applied across the LEDs.

To simplify the drawing, circuit 70 is shown as having only the two LEDs shown at 72 and 74. However, it is to be understood that each of these LEDs could be replaced by a plurality of LEDs. In particular, a plurality of LEDs connected in series allows the base unit to utilize LEDs that are normally designed to be driven at a few volts to be utilized while using a transformer 75 that outputs a peak voltage that is significantly greater than the individual LED drive voltages. This arrangement reduces the currents that must be transported within the base unit, and hence, the size of the conductors utilized for this purpose. Similarly, a number of such series-connected strings of LEDs could be connected in parallel to provide increased light output. The parallel-connected strings also reduce the number of device failures that would result from one or more of the individual LEDs failing by forming an open circuit.

The average current through each of the LEDs is controlled via silicon-controlled rectifiers (SCRs). SCR 71 controls the current through LED 72 on one half of the AC cycle, and SCR 73 controls the average current through LED 74 during the other half of the AC cycle. The fraction of the AC cycle over which the LEDs are powered is determined by the control signals to the SCRs, which are under the control of controller 76. The correct control signal is communicated to controller 76 during the initialization process described above.

In one aspect of the present invention, controller 76 includes a small AC to DC power converter 78 that provides the power for the logic circuitry in controller 76 and the SCR control signals. It should be noted that the power required to generate light from the light source is supplied directly from the AC power source, and hence, the small power supply need only supply the logic circuitry in the controller.

Figure 4:
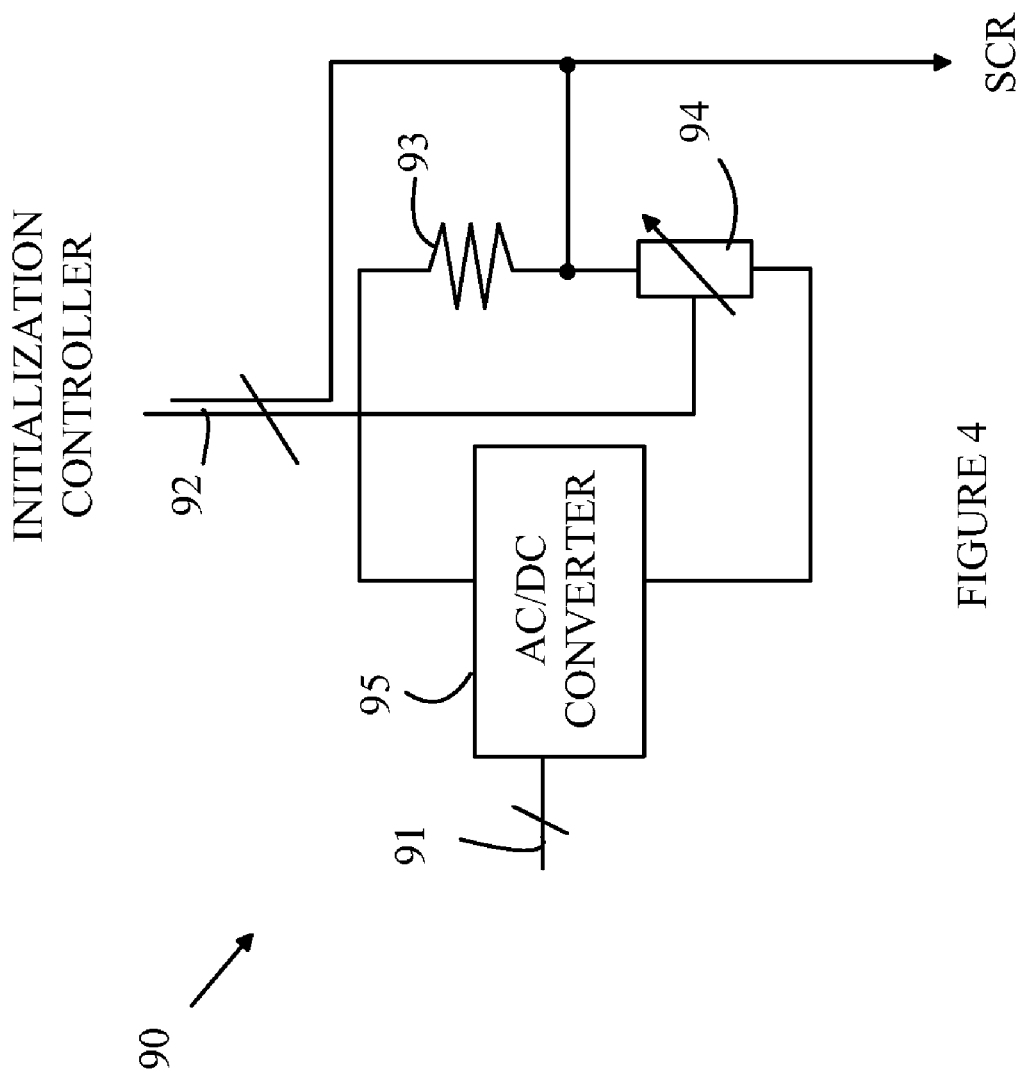
FIG. 4 illustrates one embodiment of a base unit controller according to the present invention.

In one embodiment of the present invention, the base unit controller includes only the AC/DC converter and the circuitry for generating the control signals for the SCRs. In such embodiments, photodiode 77 is absent. Refer now to FIG. 4, which illustrates one embodiment of a base unit controller according to the present invention. Base unit controller 90 includes a small AC/DC converter 95 that generates a DC signal with sufficient power to control the SCRs when connected to the AC power source that powers the base unit through bus 91. The SCR control signals are generated by dividing the output of converter 95 in a resistive divider constructed from resistor 93 and a variable resistance element 94. The resistance of variable resistance element 94 is set by signals on a bus 92 that is connected to the initialization controller. During the initialization process, the initialization controller directly controls the SCR control signal and varies that signal until the desired light output is achieved. Variable resistance element 94 is then set to provide the resistance that will generate the determined control voltage in the absence of control signals on bus 92.

Variable resistance element 94 can be constructed from an array of fixed resistors that are connected to bus lines by links that can be removed by passing a current in excess of a predetermined value through the link. In such embodiments, the links are connected to the initialization controller via bus 92. Embodiments that utilize EEPROMs that are run in an analog mode to provide a variable resistance that is determined by the charge on the gate of the EEPROM could also be utilized.

Figure 5:
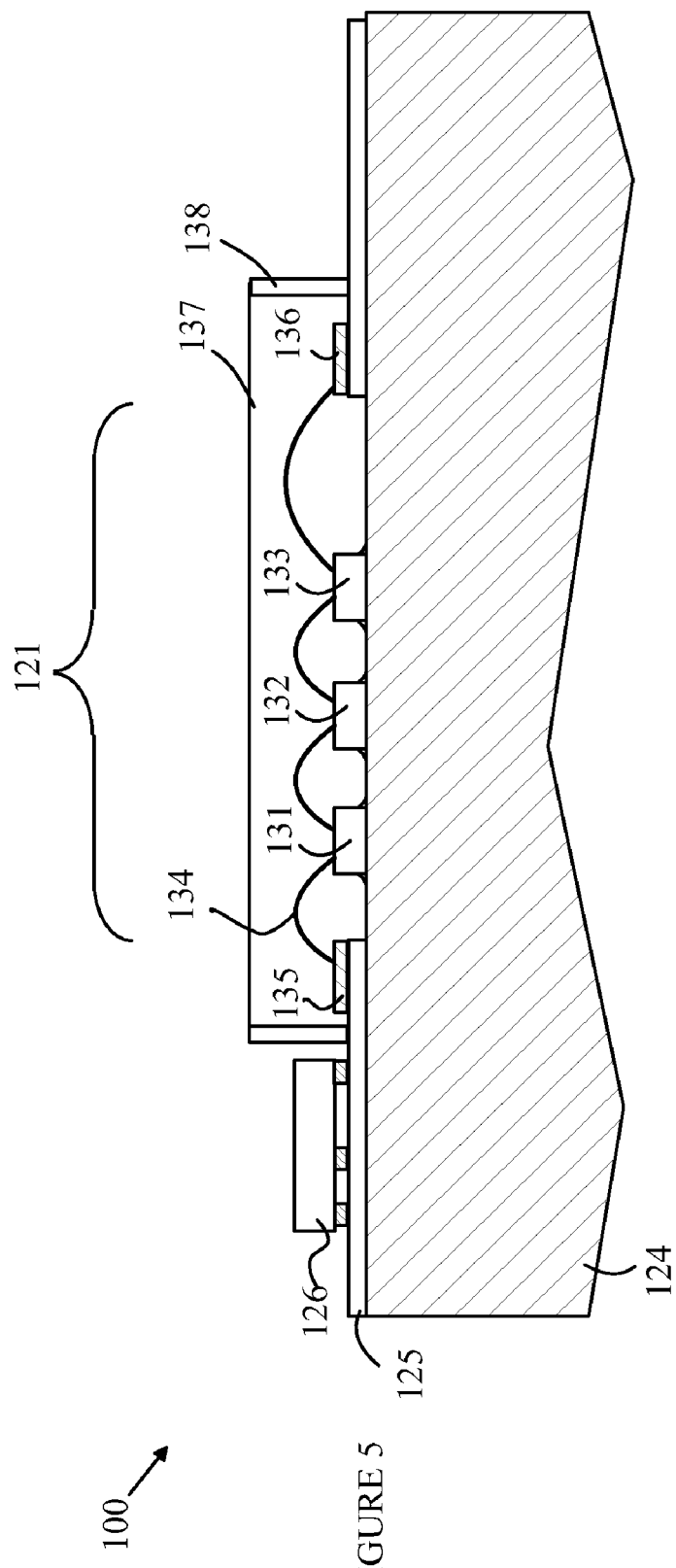
FIG. 5 is a cross-sectional view of a portion of a base unit 100 as part of the lighting device, according to one aspect of the present invention.

In one aspect of the present invention, the heat sink includes a plurality of traces that are utilized to connect a number of LEDs that are connected in series to the control circuitry. The number of LEDs and the driver circuitry used to power the LEDs can be varied without requiring that the traces be modified, and hence, the same base unit can be utilized to construct a number of lighting devices that have different light outputs. The manner in which this aspect of the present invention provides its advantages can be more easily understood with reference to FIG. 5, which is a cross-sectional view of a portion of a base unit 100 according to one aspect of the present invention as part of the lighting device. Base unit 100 includes a heat sink 124 having an insulating layer 125 that separates a number of conducting traces such as traces 135 and 136 from heat sink 124, which is constructed from a metallic material. The controller includes one or more chips such as chip 126. LEDs 131-133 are mounted in a mounting area 121 directly on heat sink 124 utilizing a heat-conducting epoxy or other heat-conducting adhesive. The individual LEDs are connected in series by wire bonds such as wire bond 134. The series connected string of LEDs is then connected to the controller via traces 135 and 136. Since the inter-string connections are made by wire bonds, the number of LEDs that are connected can be varied from base unit to base unit without requiring a different conductive trace pattern on the surface of the heat sink.

After the LEDs have been connected with the wire bonds, the LEDs and wire bonds are encapsulated in a clear material to form a protective cap 137. In one aspect of the invention, protective cap 137 is formed by attaching a ring 138 to the surface of layer 125 and then filling the ring with a clear material such as silicone. If a phosphor material is to be utilized, the phosphor particles can be incorporated in the silicone. However, other methods for providing the protective cap can be utilized. For example, a droplet of silicone or other material can be placed over the LEDs. In another aspect of the invention, the protective cap is formed separately and is placed over the LEDs leaving an air gap between the LEDs and the top surface of the protective cap. The protective cap and/or the encapsulant within the cap can include phosphor materials to convert the wavelength of the light emitted by the LEDs to light of the desired spectral composition.

As noted above, the placement of the LEDs in base unit 100 can be altered without changing the structure of the conductive traces. The number of LEDs, placement of those LEDs, and interconnections of those LEDs are determined by the device that places the LED containing dies in mounting area 121 and by the wire bonding system that makes the specific wire bonds. The operations of both of these fabrication devices are controlled by computer programs and data files that can be altered independent of the trace pattern so long as the trace pattern has sufficient terminals to make the final connections between the light source in the printed circuit board core region and the printed circuit board. Accordingly, one printed circuit board design can be utilized with a number of different devices.

It should also be noted that other dies could be placed in the mounting area 121 and connected to the LEDs. For example, driver chips that provide the current to the LEDs could be mounted in the mounting area to allow the heat generated by these chips to be dissipated by heat sink 124. In addition, LED light sources that utilize a plurality of chips that emit light in different spectral bands often include controllers that regulate the intensity of light generated in each spectral band to generate light that is perceived to be of a specific color by a human observer. These controllers could likewise be mounted in the printed circuit board core region and connected to the LEDs rather than on the printed circuit board traces if the controller is specific to the particular light source implemented in the core region.

Figure 6:
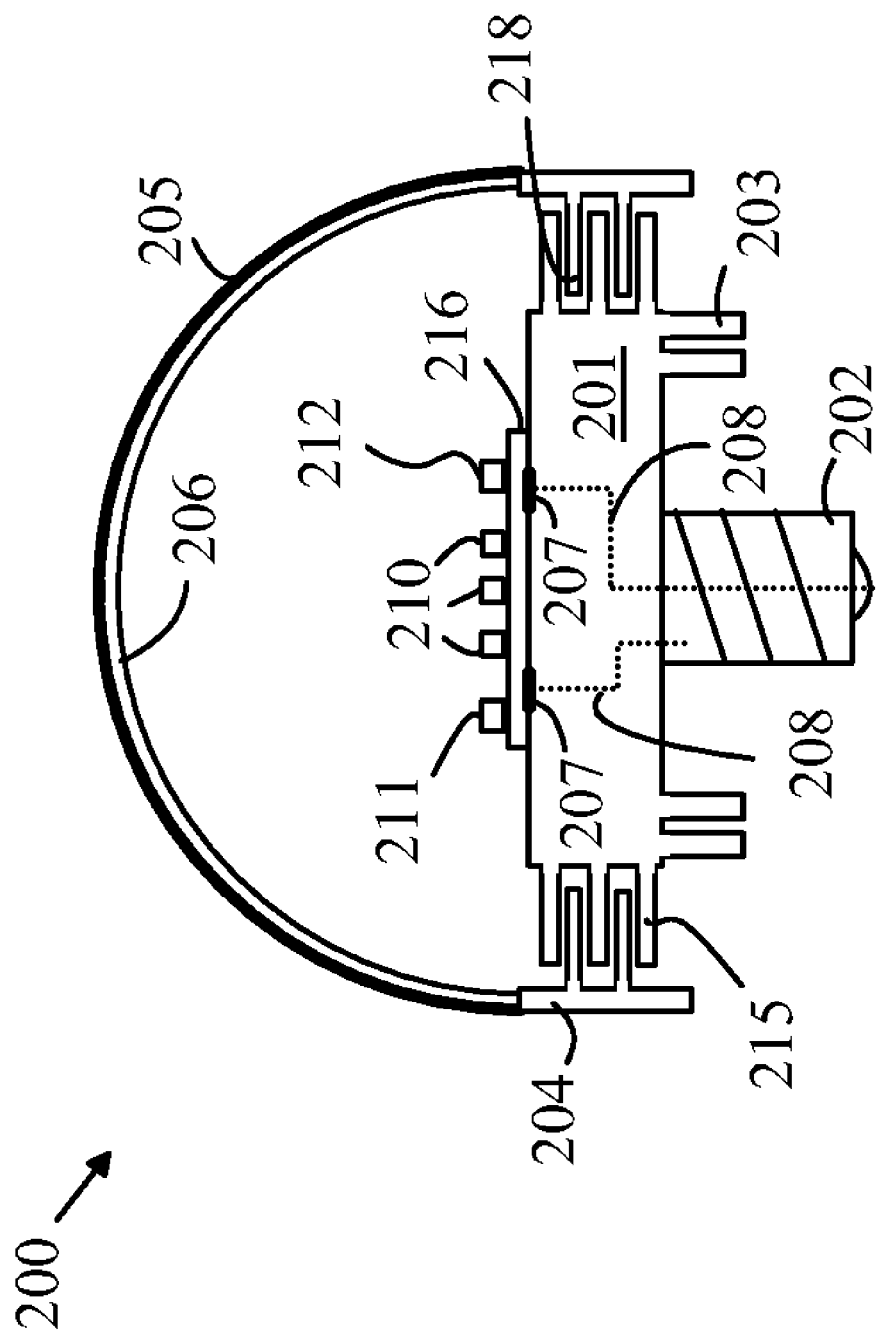
FIG. 6 is a cross-sectional view of another embodiment of a light source that utilizes a standardized base unit according to the present invention.

Refer now to FIG. 6, which is a cross-sectional view of another embodiment of a light source that utilizes a standardized base unit according to the present invention. Light source 200 is constructed from a base unit and a separate globe. The base unit utilizes a standardized heat sink 201 that is attached to a standard connector 202, which, in this embodiment, is a threaded bulb connector that mates with a light socket that is designed to receive a conventional incandescent bulb.

A plurality of LEDs 210 are mounted on a substrate 216 that is bonded to heat sink 201 by a heat conducting bond. The LEDs can be in the form of packaged chips or bare chips. If bare chips are used, a layer of protective material can be applied over the chips as discussed above.

Substrate 216 can also include control circuits 211 and drivers 212 that are sized for the particular power needs of the LEDs. Substrate 216 is preferably constructed from a material that has a high thermal conductivity and which can support a plurality of traces 207 for connecting the various components to matching traces 208 on heat sink 201 that provide connections to connector 202.

Heat sink 201 can include a plurality of fins shown at 203 and 215 that facilitate the dissipation of the heat generated by the components on substrate 216 to the ambient environment. These fins can be arranged so as to provide a threaded exterior to which globe 206 is connected. Alternatively, globe 206 can provide a flexible section 204 that allows a set of mating protrusions 218 to be reversibly engaged with protrusions 215 such that globe 206 can "clip" onto heat sink 201. In either arrangement, heat sink 201 can accommodate a plurality of different globes that can be applied by the manufacturer or by the consumer of the light source. Hence, the consumer can change the color temperature of the light source by changing only the globe. In addition, the globe can be recycled when the LEDs or other components in the base fail and require replacement.

Globe 206 can include a phosphor to convert a portion of the light generated by the LEDs to light having a different spectrum. In principle, the phosphor could be dispersed in a clear medium that fills globe 206. However, such an arrangement traps heat generated by the phosphor in the interior of globe 206. The efficiency of the phosphors that are typically utilized in lighting systems decreases significantly as a function of temperature. The phosphors convert part of the light incident thereon to light of the desired spectrum; however, a significant fraction of the incident light is converted to heat. Hence, heat dissipation is an important consideration. By providing a phosphor layer 205 on the outside surface of globe 206, heat generated by the absorption of the light by the phosphor can be dissipated to the ambient environment. In addition, the surface area over which the heat is generated and dissipated is significantly larger than the corresponding area in embodiments in which the LEDs are covered with a layer of phosphor that is proximate to the LEDs.

It should be noted that the phosphor layer could be on the inside surface of globe 206 or dispersed within the transparent material from which globe 206 is constructed. Placing the phosphor layer on the inside surface reduces the heat dissipation aspect of the invention; however, this arrangement provides protection for the phosphor layer from environmental attack. Dispersing the phosphor within the shell provides protection for the phosphor and improved heat dissipation relative to a phosphor layer on the inside surface of the shell. In addition, organic phosphors that are dissolved in a plastic globe can be utilized, since the globe is isolated from the high temperatures associated with the individual LED chips on the heat sink. Furthermore, the phosphor operates at a lower temperature because of the isolation of the phosphor layer from the heat generated by the LED chips.

It should also be noted that different phosphor compositions can be included in different globes, and hence, the end user can change to the color spectrum of the light source merely by changing the globe. The different globes could include different phosphors or different concentrations of the same phosphor. For example, in a white LED that was obtained by converting a portion of the blue light emitted by the LEDs to yellow light, the concentration of the phosphor in the globe controls the ratio of blue light to yellow light in the output of the light source, and hence, changing the concentration will shift the spectrum of light emitted from the light source.

In addition, the different globes could have different shapes and sizes. In this regard, it is to be understood that the term globe as used herein is defined to include any shaped object, not just spherical or bowl shaped objects. For example, cylindrical objects that attach reversibly to the base units are also included in the term "globe".

The above-described embodiments of the present invention have utilized base units with adapters that allow the base units to be plugged into the sockets currently being utilized for incandescent bulbs. However, adapters that allow the base units to be plugged into other conventional lighting sockets such as those used for fluorescent bulbs could also be utilized. For the purposes of this discussion, a conventional bulb power adapter is defined to be an adapter that would accept a conventional non-LED light bulb or fluorescent fixture.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
   a heat sink;
   an LED light source mounted on said heat sink;
   a power adapter configured to be interchangeable with a conventional bulb power adapter; and
   a controller that provides an average current to said LED light source when power is coupled to said apparatus via said power adapter, said average current causing said LED light source to generate light of a predetermined standard intensity that is substantially independent of variations in said LED light source;
   wherein said controller comprises an integrated circuit mounted on said heat sink.

2. The apparatus of claim 1 wherein said conventional bulb power adapter comprises a threaded base adapted to screw into a light socket adapter.

3. The apparatus of claim 1 wherein said LED light source comprises a plurality of LEDs connected in series, said LEDs being bonded to said heat sink and connected to one another in series by wire bonds.

4. The apparatus of claim 3 wherein two of said LEDs are connected to conducting traces on said heat sink.

5. The apparatus of claim 1 wherein said LED light source comprises an LED and a layer of phosphor that converts light from said LED to light of a different wavelength.

6. The apparatus of claim 1 further comprising an AC to DC converter that converts an AC voltage coupled to said power adapter to a DC power source that powers said controller.

7. The apparatus of claim 1 further comprising a first half-wave rectifier that converts an AC voltage coupled to said power adapter to a first half-wave rectified power source having a duty cycle that provides said predetermined light intensity when said first half-wave rectified power source is used to power said light source.

8. The apparatus of claim 7 wherein said first half-wave rectifier comprises a silicon-controlled rectifier having a control signal chosen to provide said predetermined light intensity, said control signal having a value that depends on a measured value of said light from said LED light source when said light source is operated on said heat sink.

9. The apparatus of claim 7 wherein said LED light source comprises first and second LEDs and wherein said first LED is powered by said first half-wave rectifier and said second LED is powered by a second half-wave rectifier having an output that is 180 degrees out of phase with said first half-wave rectified power source.

10. The apparatus of claim 1 wherein said heat sink is adapted for receiving any of a plurality of different light diffusing elements, each of said light diffusing elements being configured to diffuse and redirect light from said light source.

11. The apparatus of claim 10 further comprising a photodetector that measures an intensity of light in said diffusing element, said controller utilizing said measured light intensity to maintain said predetermined standard intensity.

12. The apparatus of claim 1 further comprising a globe that covers said LED light source, said globe comprising a layer of phosphor on a surface thereof.

13. The apparatus of claim 12 wherein said globe comprises a transparent shell and wherein said phosphor is deposited on a surface of said transparent shell.

14. The apparatus of claim 12 wherein said globe comprises an adapter for reversibly attaching said globe to said light source.

15. A method for providing a base element for use in constructing LED-based lighting devices, said method comprising:
   providing a base element comprising
      a heat sink;
      an LED light source mounted on said heat sink;
      a power adapter configured to be interchangeable with a conventional incandescent bulb power adapter; and
      a base unit controller that provides an average current to said LED light source when power is coupled to said apparatus via said power adapter, said average current causing said LED light source to generate light;
   connecting said base unit to a factory controller that includes a photodetector that measures light from said base unit;
   causing said base unit controller to vary said average current through said LED light source while measuring an intensity of light generated by said LED light source utilizing said photodetector until a predetermined intensity of light is measured; and
   storing information specifying said average current that caused said LED light source to generate said predetermined intensity of light, wherein said base unit controller provides said average current to said LED light source when power is coupled to said power adapter; and
   wherein said base unit controller comprises an integrated circuit mounted on said heat sink.

16. The method of claim 15 wherein said base unit controller comprises an SCR and said information specifies a control signal for said SCR.

17. A lighting system comprising a base unit and a first detachable globe, said base unit comprising:
- a heat sink;
- an LED light source mounted on said heat sink, said LED light source generating light characterized by a first spectrum;
- a power adapter configured to be interchangeable with a conventional bulb power adapter; and
- a controller that provides an average current to said LED light source when power is coupled to said apparatus via said power adapter, said average current causing said LED light source to generate light of a predetermined standard intensity that is substantially independent of variations in said LED light source from one of said lighting systems to another of said lighting systems,
- wherein said first detachable globe comprises a transparent shell having a first phosphor composition on or contained in said shell and an adapter for attaching said first detachable globe to said base unit, said phosphor composition converting a portion of said light from said LED light source to light having a second spectrum that is different from said first spectrum.

18. The system of claim 17 wherein said first detachable globe comprises a plastic and wherein said first phosphor composition comprises an organic phosphor dissolved in said plastic.

* * * * *